(12) United States Patent
Bulliard et al.

(10) Patent No.: US 8,974,889 B2
(45) Date of Patent: Mar. 10, 2015

(54) NANOSTRUCTURED THIN FILM AND METHOD FOR CONTROLLING SURFACE PROPERTIES THEREOF

(75) Inventors: Xavier Bulliard, Yongin-si (KR); Anass Benayad, Yongin-si (KR); Jong Jin Park, Yongin-si (KR); Jae Cheol Lee, Suwon-si (KR); Yun Hyuk Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 1194 days.

(21) Appl. No.: 12/237,808

(22) Filed: Sep. 25, 2008

(65) Prior Publication Data
US 2010/0279066 A1    Nov. 4, 2010

(30) Foreign Application Priority Data
Jul. 9, 2008  (KR) .................. 10-2008-0066639

(51) Int. Cl.
*B32B 5/12*    (2006.01)
*B82Y 30/00*   (2011.01)
*C23C 16/40*   (2006.01)

(52) U.S. Cl.
CPC .............. *B82Y 30/00* (2013.01); *C23C 16/401* (2013.01); *Y10S 977/707* (2013.01)
USPC .......................................... 428/143; 977/707

(58) Field of Classification Search
USPC .......................................... 428/143; 977/707
See application file for complete search history.

(56) References Cited

U.S. PATENT DOCUMENTS

| | | | |
|---|---|---|---|
| 7,985,451 B2 * | 7/2011 | Luzinov et al. | 427/258 |
| 2006/0147675 A1 * | 7/2006 | Nun et al. | 428/141 |
| 2006/0246297 A1 * | 11/2006 | Sakoske et al. | 428/426 |

* cited by examiner

*Primary Examiner* — William P Watkins, III
(74) *Attorney, Agent, or Firm* — Cantor Colburn LLP

(57) ABSTRACT

Disclosed herein is a nanostructured thin film. The nanostructured thin film comprises a nanoparticle layer and a number of micro-undulated surfaces formed on the nanoparticle layer. The two micro-undulated structures of the nanostructured thin film are uniformly introduced over a large area. This configuration makes it easy to control the surface properties of the nanostructured thin film. Therefore, the nanostructured thin film can be widely applied to a variety of devices. Also disclosed herein is a method for controlling the surface properties of the nanostructured thin film.

18 Claims, 4 Drawing Sheets

NANOSTRUCTURED THIN FILM AND METHOD FOR CONTROLLING SURFACE PROPERTIES THEREOF

CROSS-REFERENCE TO RELATED APPLICATIONS

This non-provisional application claims priority under U.S.C. §119 to Korean Patent Application No. 2008-66639, filed on Jul. 9, 2008, the entire contents of which is incorporated herein in its entirety by reference.

BACKGROUND

1. Field

This disclosure is directed to a nanostructured thin film and a method for controlling the surface properties of the nanostructured thin film. More specifically, the nanostructured thin film comprises a nanoparticle layer including a number of nanoparticles and micro-undulated surfaces formed on the nanoparticles.

2. Description of the Related Art

In general, the electrical, magnetic, optical and chemical properties of quantum-sized materials differ significantly from those of the corresponding macroscopic materials. Due to these differences, quantum-sized materials exhibit various interesting chemical and physical properties, such as melting point depression, metal-insulator transition, single electron tunneling and near-field optical properties. In addition, the physical properties of nanometer-sized materials are intimately associated with their regular two- or three-dimensional arrangement. To accurately understand the physical properties of nanometer-sized materials, there is a need to develop a model whose structural or spatial regularity is well defined.

Furthermore, the luminescent properties, electrical properties, optical properties and physical properties of nanostructures can be controlled by varying the size and composition of the nanostructures. Based on these characteristics, nanostructures are becoming increasingly important in the development of sub-micron sized, high-integration and high-performance circuits and sensors, ultrahigh-density data storage media, optical devices and electrical devices. Under these circumstances, research on nanostructures is actively underway for a variety of applications. Thus, there is a need to develop a nanostructured thin film whose physicochemical properties are easily controllable and that is easy to produce.

SUMMARY

In an embodiment, a nanostructured thin film is disclosed, which comprises a nanoparticle layer including a number of nanoparticles and micro-undulated surfaces formed on the nanoparticles.

The micro-undulated surfaces may be smaller in size than the nanoparticles.

The nanoparticles may have a single or core-shell double structure composed of an inorganic material, a metal, a semiconductor or a polymer; and the micro-undulated surfaces may include a metal oxide, a metal nitride, a metal carbide, etc.

The nanostructured thin film is applicable to a variety of microfluidic devices because its surface energy, optical properties and electrical properties can be controlled in an easy manner.

In another embodiment, a method for controlling the surface properties of a nanostructured thin film is disclosed, which comprises forming a nanoparticle layer including a number of nanoparticles and forming a number of micro-undulated surfaces having a size smaller than that of the nanoparticles on the nanoparticles.

The nanoparticle layer may be formed by applying inorganic material, metal, semiconductor or polymer nanoparticles to a substrate by colloidal lithography; and the micro-undulated surfaces may be formed using a metal oxide, a metal nitride or a metal carbide by a chemical vapor deposition process, a physical vapor deposition process, such as RF magnetron sputtering, DC magnetron sputtering, ion/e-beam sputtering or pulsed laser deposition, or an atomic layer deposition process.

According to the method, the surface properties (e.g., surface energy and optical properties) of the nanostructured thin film on a large area can be controlled as intended.

In another embodiment, an electronic device is disclosed, which comprises the nanostructured thin film.

BRIEF DESCRIPTION OF THE DRAWINGS

Exemplary embodiments will be more clearly understood from the following detailed description taken in conjunction with the accompanying drawings, in which.

DETAILED DESCRIPTION

Figure 1A:
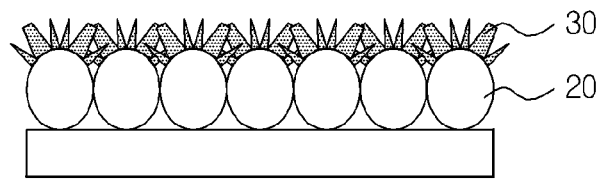
FIGS. 1a and 1b are schematic cross-sectional diagrams illustrating the structures of nanostructured thin films.

Hereinafter, a detailed description will be given of exemplary embodiments with reference to the accompanying drawings.

It will be understood that when an element or layer is referred to as being "on," "interposed," "disposed," or "between" another element or layer, it can be directly on, interposed, disposed, or between the other element or layer or intervening elements or layers may be present.

It will be understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another element, component, region, layer or section.

Thus, first element, component, region, layer or section discussed below could be termed second element, component, region, layer or section without departing from the teachings of the present invention.

As used herein, the singular forms "a," "an" and "the" are intended to comprise the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In an embodiment, a nanostructured thin film is provided wherein the nanostructured thin film comprises a nanoparticle layer including a number of nanoparticles and micro-undulated surfaces formed on the nanoparticles.

The term "nanoparticle layer" used herein refers to a layer composed of a number of nanoparticles arranged adjacent to or spaced apart from one another to form a nanoscale undulated structure.

Surface energy control in thin films has drawn attention as a technology utilizing self-cleaning effects to prevent surface contamination and moisture infiltration in devices and touch screens. For example, when glass substrates for use in conventional flat panel displays are used as touch screens without any surface treatment, contaminants such as fingerprint residue may induce malfunction of the devices. In contrast, the surface energy of the nanostructured thin film can be controlled to change the surface state from hydrophilic to hydrophobic, or vice versa. This hydrophilic/hydrophobic surface control can be widely used to prevent display screens from contamination, to protect the surface of outdoor objects from ice and stains, and to fabricate microfluidic devices.

FIG. 1a is an exemplary schematic cross-sectional diagram illustrating the structure of the nanostructured thin film. Referring to FIG. 1a, the nanostructured thin film comprises a nanoparticle layer 20 including a number of nanoparticles and a number of micro-undulated surfaces 30 formed on the nanoparticle surface of the nanoparticle layer 20. The nanoparticle layer 20 may have a monolayer or multilayer structure.

The micro-undulated surfaces 30 may be smaller in size than the nanoparticles. For example, the nanoparticles of the nanoparticle layer 20 may have a size of several tens of nanometers to several micrometers, and the micro-undulated surfaces 30 may have a size of several nanometers to several hundreds of nanometers. The sizes of the nanoparticles and the micro-undulated surfaces may also be in the micrometer range.

The micro-undulated surfaces 30 may be formed in a plural number. The micro-undulated surfaces 30 formed on the nanoparticles may have various shapes, for example, nanoflowers, nanotrees, nanobouquets, nanodots, nanobelts, nanoribbons, nanopyramids, nanowavys and nanocavities.

The nanoparticles may have a single or core-shell double structure composed of an inorganic material, a metal, a semiconductor or a polymer. For example, the nanoparticles 20 may include at least one material selected from the group consisting of gold, silver, chromium, molybdenum, nickel, cobalt, iron, titanium, ZnO, alumina, silicon and polystyrene.

The single-structured nanoparticles may be composed of a semiconductor compound selected from the group consisting of Group II-VI compounds, Group II-V compounds, Group III-VI compounds, Group III-V compounds, Group IV-VI compounds, Group compounds, Group II-IV-VI compounds, Group II-IV-V compounds, alloys thereof, and combinations thereof. Specific examples of materials for the single-structured nanoparticles include CdS, CdSe, CdTe, ZnS, ZnSe, ZnTe, HgS, HgSe, HgTe, GaN, GaP, GaAs, InP, InAs, InSb, AlN, AlP, AlAs, AlSb, SiC, Fe, Pt, Ni, Co, Al, Ag, Au, Cu, FePt, Si, Ge, PbS, PbSe, PbTe, alloys thereof, and combinations thereof.

The nanoparticles may have a core-shell double structure. The core of the double-structured semiconductor nanoparticles may be selected from the group consisting of CdS, CdSe, CdTe, ZnS, ZnSe, ZnTe, HgS, HgSe, HgTe, GaN, GaP, GaAs, InP, InAs, InSb, AlN, AlP, AlAs, AlSb, SiC, Fe, Pt, Ni, Co, Al, Ag, Au, Cu, FePt, Si, Ge, PbS, PbSe, PbTe, alloys thereof, and combinations thereof; and the shell may be selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, alloys thereof, and combinations thereof.

The micro-undulated surfaces 30 may include a metal oxide, a metal nitride or a metal carbide. Examples of the metal oxide include, but are not necessarily limited to: $TiO_2$, ZnO, $CO_3O_4$, CoO, $SiO_2$, $SnO_2$, $WO_3$, $Ta_2O_3$, $BaTiO_3$, $BaZrO_3$, $ZrO_2$, $HfO_2$, $Al_2O_3$, $Y_2O_3$, $ZrSiO_4$, $Fe_2O_3$, $Fe_3O_4$, CeO, $CrO_3$, and mixtures thereof. The metal oxide may be a two-component system such as $SiO_2$—$ZrO_2$, $SiO_2$—$TiO_2$ or $TiO_2$—$ZrO_2$, or a three-component system such as $V_2O_5$—$SiO_2$—$Nb_2O_5$.

Figure 1B:
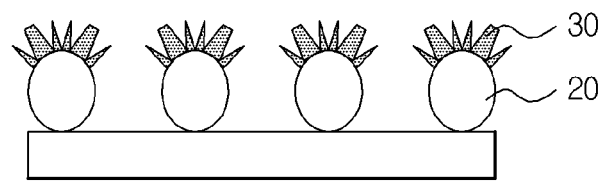

The nanoparticles of the nanoparticle layer 20 may be arranged adjacent to one another (FIG. 1a) or spaced apart from one another at regular intervals (FIG. 1b). By controlling the density of the nanoparticles, the wetting properties (hydrophobicity/hydrophilicity) and optical properties of the nanostructured thin film can be controlled.

Although not shown in the figures, the nanoparticle layer 20 may be formed patternwise on a substrate. Patterning of a nanostructure on a substrate is well known in the art.

The surface roughness and optical properties (e.g., refractive index and diffusion properties) of the nanostructured thin film can be controlled. The contact angle (θ) of a droplet on a solid surface is indicative of water repellency. Generally, the solid surface is evaluated to be water repellent (hydrophobic) when θ≥90°, highly water repellent when 110°≤θ≤150°, and superhydrophobic when θ>150°. As the roughness of the solid surface increases, the hydrophobicity of the solid surface increases. The contact angle of a flat hydrophobic surface is typically from 100° to 120°, whereas that of a rough surface or a finely rugged surface amounts to 160° to 170°. The surface properties of the nanostructured thin film can be controlled from superhydrophobicity to superhydrophilicity.

For additional functionalization, a material with low surface energy can be used to chemically modify the surface of the nanostructured thin film. Suitable materials are silane compounds and fluorinated polymers, and examples thereof include, but are not necessarily limited to: fluorinated silane compounds, such as 3,3,3-trifluoropropylsilane, tridecafluoro-1,1,2,2-tetrahydrooctylsilane, pentafluorophenylsilane, heptadecafluoro-1,1,2,2-tetrahydrodecylsilane, 3-heptafluoroisopropoxypropylsilane and trifluoroethylsilane;

alkyl silane compounds containing methyl, ethyl, n-propyl, n-butyl, isobutyl, hexyl, hexadecyl, n-heptyl, n-octyl, n-octadecyl, dodecyl, decyl, pentyl, docosyl or bis(trimethylsilylmethyl) group; and silicone precursors, such as dimethyldimethoxysilane and dimethyldiethoxysilane.

Superhydrophobicity and superhydrophilicity are phenomena based on the same basic principle. That is, superhydrophobicity and superhydrophilicity are results obtained from simultaneous interaction of a micro- or nano-scale structure and a chemical composition of a surface. A hydrophilic surface having a micro- or nano-scale structure exhibits superhydrophilicity, and a hydrophobic surface having a micro- or nano-scale structure exhibits superhydrophobicity. In the exemplary embodiments, the two opposite phenomena based on the same principle can be optionally attained by simple processing. The nanostructured thin film has a structure in which the smaller micro-undulated surfaces formed on the larger nanoparticles have a double morphology. Due to this structure, the nanostructured thin film has a double morphology to achieve both superhydrophilicity and superhydrophobicity.

In the case of superhydrophobicity, the nanostructured thin film can be applied to barrier thin films, water-repellent coatings and self-cleaning coatings capable of preventing contamination by water or other contaminants. In the case of superhydrophilicity, a liquid containing biomolecules can be applied to the nanostructured thin film to form a completely flat layer without leaving any droplets. Furthermore, the nanostructured thin film can have a composite surface exhibiting both hydrophilicity and hydrophobicity. In this case, the nanostructured thin film is useful as a channel in a microfluidic device.

In another embodiment, a method for controlling the surface properties of a nanostructured thin film is provided.

According to the method, a nanoparticle layer is formed in which a number of nanoparticles are included to form an undulated structure, and then a number of micro-undulated surfaces having a size smaller than that of the nanoparticle layer are formed on the nanoparticles to produce a nanostructured thin film with an undulated surface bilayer structure. The surface energy, optical properties and electrical properties of the final nanostructured thin film can be controlled by varying various production parameters.

Figure 2:
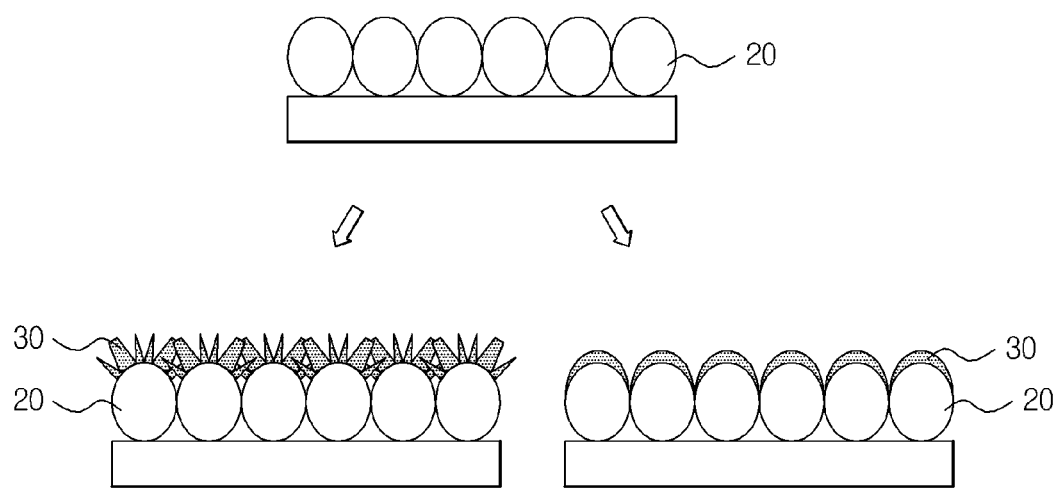
FIG. 2 shows schematic diagrams for explaining a method for controlling the surface properties of a nanostructured thin film: micro-undulated surfaces with a nanoflower structure partially coated on a high-density cubic nanoparticle monolayer (left); and micro-undulated surfaces with a nanowavy structure uniformly coated on a high-density cubic nanoparticle monolayer (right)
Figure 3:
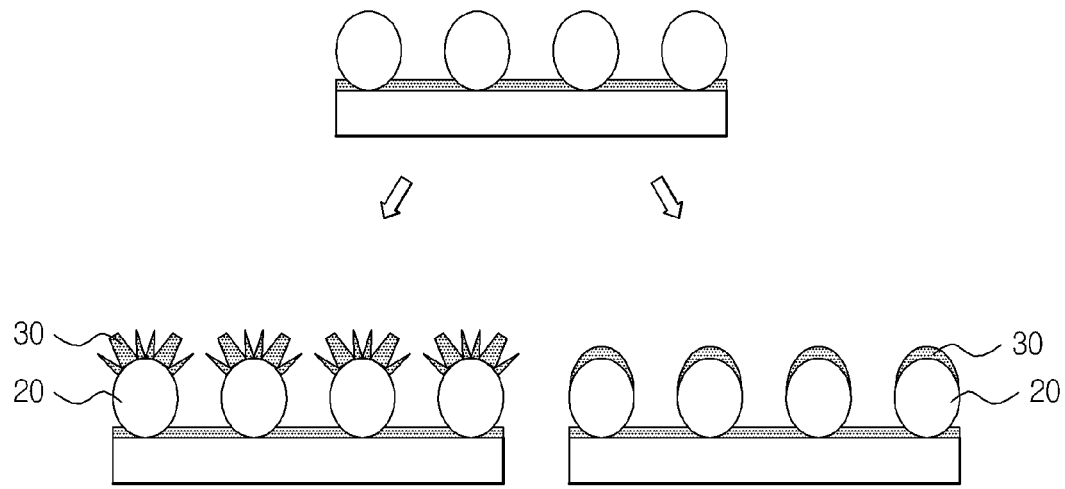
FIG. 3 shows schematic diagrams for explaining another method for controlling the surface properties of a nanostructured thin film: micro-undulated surfaces with a nanoflower structure partially coated on a low-density nanoparticle monolayer (left); and micro-undulated surfaces with a nanowavy structure uniformly coated on a low-density nanoparticle monolayer (right)

FIGS. 2 and 3 show schematic diagrams for explaining methods for controlling the surface properties of nanostructured thin films. Referring to FIG. 2, first, a nanoparticle layer 20 including a number of nanoparticles is formed.

In the first step, the nanoparticle layer may be formed by applying inorganic material, metal, semiconductor or polymer nanoparticles to a substrate by colloidal lithography. For example, colloidal particles can be self-arranged on a substrate. An aqueous solution of the nanoparticles is applied to a substrate, followed by drying to self-arrange the nanoparticles on the substrate. The application can be performed by various processes, such as spin coating, dip coating, flow coating, doctor blade coating, dispensing, inkjet printing, offset printing, screen printing, pad printing and gravure printing.

Depending on the application process used, the application processing and the arrangement of nanoparticles may be varied. In the case of dip coating (FIG. 2), a substrate is cleaned, dipped in a dispersion of nanoparticles in water, taken from the dispersion, and dried to evaporate the water to form a high-density hexagonal close-packed structure in which the nanoparticles are regularly arranged. In FIG. 2, the left diagram shows the formation of micro-undulated surfaces with a nanoflower structure partially coated on a high-density cubic nanoparticle monolayer, and the right diagram shows the formation of micro-undulated surfaces with a nanowavy structure uniformly coated on a high-density cubic nanoparticle monolayer. On the other hand, in the case where a dispersion of the nanoparticles is applied by spin coating (FIG. 3), a substrate is treated with a charged polymeric electrolyte (optional), poly(allylamine hydrochloride) and polyacrylic acid, and then the dispersion is spin-coated at a medium rate on the substrate to uniformly disperse the nanoparticles at a low density. The nanoparticles may be formed into a monolayer or multilayer structure upon formation of the nanoparticle layer or micro-undulated surfaces. In FIG. 3, the left diagram of shows the formation of micro-undulated surfaces with a nanoflower structure partially coated on a low-density nanoparticle monolayer, and the right diagram shows the formation of micro-undulated surfaces with a nanowavy structure uniformly coated on a low-density nanoparticle monolayer.

The nanoparticles may have a single or core-shell double structure composed of an inorganic material, a metal, a semiconductor or a polymer. For example, the nanoparticles 20 may include at least one material selected from the group consisting of gold, silver, chromium, molybdenum, nickel, cobalt, iron, titanium, ZnO, alumina, silicon and polystyrene.

The single-structured nanoparticles may be composed of a semiconductor compound selected from the group consisting of Group II-VI compounds, Group II-V compounds, Group III-VI compounds, Group III-V compounds, Group IV-VI compounds, Group compounds, Group II-IV-VI compounds, Group II-IV-V compounds, alloys thereof, and combinations thereof. Specific examples of materials for the single-structured nanoparticles include CdS, CdSe, CdTe, ZnS, ZnSe, ZnTe, HgS, HgSe, HgTe, GaN, GaP, GaAs, InP, InAs, InSb, AlN, AlP, AlAs, AlSb, SiC, Fe, Pt, Ni, Co, Al, Ag, Au, Cu, FePt, Si, Ge, PbS, PbSe, PbTe, alloys thereof, and combination thereof.

The nanoparticles may have a core-shell double structure. The core of the double-structured semiconductor nanoparticles may be selected from the group consisting of CdS, CdSe, CdTe, ZnS, ZnSe, ZnTe, HgS, HgSe, HgTe, GaN, GaP, GaAs, InP, InAs, InSb, AlN, AlP, AlAs, AlSb, SiC, Fe, Pt, Ni, Co, Al, Ag, Au, Cu, FePt, Si, Ge, PbS, PbSe, PbTe, alloys thereof, and combinations thereof; and the shell may be selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, alloys thereof, and combinations thereof.

The micro-undulated surfaces may be formed by a vapor deposition process, RF magnetron sputtering or DC magnetron sputtering, an ion/e-beam sputtering process, a pulsed laser deposition process, or an atomic layer deposition process. The micro-undulated surfaces formed on the nanoparticles may have various shapes, for example, nanoflowers, nanotrees, nanobouquets, nanodots, nanobelts, nanoribbons, nanopyramids, nanowavys and nanocavities. Unlike in the prior art, the micro-undulated surfaces can be formed in a simple manner within 2 to 10 minutes at room temperature without the need for high-temperature processing.

The micro-undulated surfaces 30 may include a metal oxide, a metal nitride or a metal carbide. Examples of the metal oxide include, but are not necessarily limited to: $TiO_2$, ZnO, $CO_3O_4$, CoO, $SiO_2$, $SnO_2$, $WO_2$, $Ta_2O_3$, $BaTiO_3$, $BaZrO_3$, $ZrO_2$, $HfO_2$, $Al_2O_3$, $Y_2O_3$, $ZrSiO_4$, $Fe_2O_3$, $Fe_3O_4$, CeO, $CrO_2$, and mixtures thereof. The metal oxide may be a two-component system such as $SiO_2$—$ZrO_2$, $SiO_2$—$TiO_2$ or $TiO_2$—$ZrO_2$, or a three-component system such as $V_2O_5$—$SiO_2$—$Nb_2O_5$.

The surface properties of the nanostructured thin film can be controlled by varying the diameter and surface roughness of the nanoparticles. The surface of the nanostructured thin film can be chemically modified by using a low surface energy material, such as a silane compound or a fluorinated polymer. The nanostructured thin film treated with the low surface energy material exhibits superhydrophilicity by capillary action due to the micro-undulated surfaces. Examples of such low surface energy materials include: fluorinated silane compounds, such as 3,3,3-trifluoropropylsilane, tridecafluoro-1,1,2,2-tetrahydrooctylsilane, pentafluorophenylsilane, heptadecafluoro-1,1,2,2-tetrahydrodecylsilane, 3-heptafluoroisopropoxypropylsilane and trifluoroethylsilane; alkyl silane compounds containing methyl, ethyl, n-propyl, n-butyl, isobutyl, hexyl, hexadecyl, n-heptyl, n-octyl, n-octadecyl, dodecyl, decyl, pentyl, docosyl or bis(trimethylsilylmethyl) group; dimethyldimethoxysilane; and dimethyldiethoxysilane.

In yet another embodiment, an electronic device is provided which comprises the nanostructured thin film. Examples of the electronic device include, but are not necessarily limited to, LEDs, laser devices, memory devices, sensors and photovoltaic devices. The nanostructured thin film can also be applied to microfluidic devices. Further, the nanostructured thin film can be used to fabricate biosensors, such as DNA chips and physiological monitoring sensors, optical biosystems, bioelectronic devices, biological nanomachines, etc. Further, the nanostructured thin film is applicable to various functional coatings. Such functional coatings may be self-cleaning coatings, water repellent coatings, hydrophilic coatings or contamination-free coatings.

A better understanding of exemplary embodiments will be described in more detail with reference to the following examples. However, these examples are given merely for the purpose of illustration and are not to be construed as limiting the scope of the embodiments.

EXAMPLES

Example 1

An aqueous solution (0.5 wt %) of $SiO_2$ nanoparticles (size=100 nm) was coated on a pre-cleaned silicon substrate (5 cm×5 cm) by dip coating to form a nanoparticle layer. In the nanoparticle layer, the nanoparticles were self-arranged due to the adhesive force of the nanoparticles. Subsequently, RF magnetron sputtering was performed for 10 minutes while controlling the flow rates of oxygen and argon gases to introduce micro-undulated surfaces composed of cobalt oxide on the nanoparticles, thereby completing the production of a nanostructured thin film.

Example 2

150 ml of (tridecafluoro-1,1,2,2-tetrahydrooctyl)trimethoxysilane as a liquid precursor was deposited on the nanostructured thin film produced in Example 1 by chemical vapor deposition in a sealed reaction container at 100° C.

Figure 4:
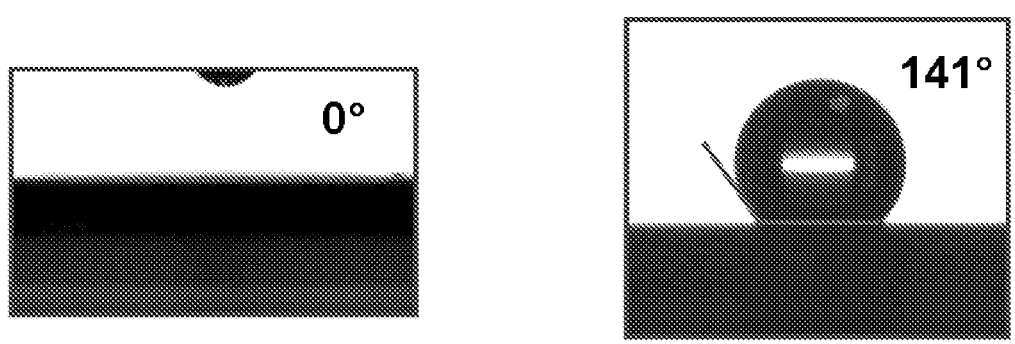
FIG. 4 shows contact angles of nanostructured thin films produced in Examples 1 and 2.

The contact angles of the nanostructured thin films produced in Examples 1 and 2 were measured (FIG. 4). Referring to FIG. 4, the contact angle of the nanostructured thin film produced in Example 1 (left) was almost zero, indicating superhydrophilicity, and the contact angle of the nanostructured thin film treated with the fluorinated compound produced in Example 2 (right) was 141°, indicating superhydrophobicity. These results demonstrate that the surface properties of the nanostructure could be controlled from superhydrophilicity to superhydrophobicity by the introduction of the hydrophobic groups into the surface of the nanostructure.

Comparative Example 1

Cobalt oxide was introduced on a pre-cleaned silicon substrate (5 cm×5 cm) to form a thin film. The contact angle of the thin film was measured. The thin film was treated with (tridecafluoro-1,1,2,2-tetrahydrooctyl)trimethoxysilane in the same manner as in Example 2. The contact angle of the treated thin film was measured (FIG. 5).

Figure 5:
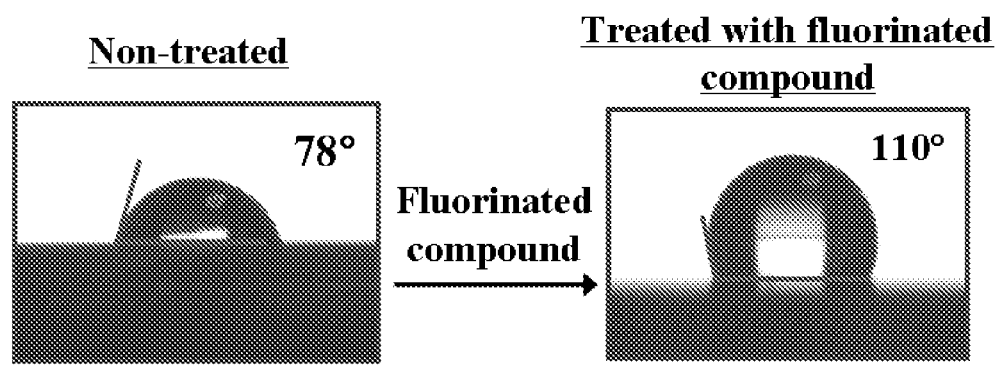
FIG. 5 shows contact angles of nanostructured thin films produced in Comparative Example 1.

Referring to FIG. 5, the contact angles of the cobalt oxide-introduced thin film (left) and the thin film (right) treated with the hydrophobic fluorinated compound were 78° and 110°, respectively.

Experimental Example 1

Figure 6:
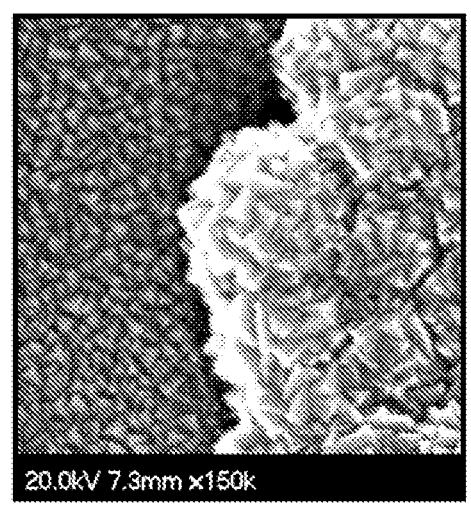
FIG. 6 is a scanning electron microscope (SEM) image showing nanoparticles and micro-undulated surfaces of a nanostructured thin film produced in Example 1.
Figure 7:
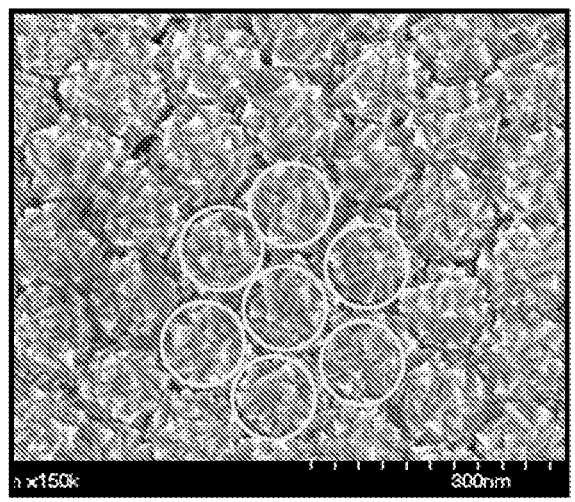
FIG. 7 is a surface SEM image of a high-density nanostructure produced in Example 1.

FIGS. 6 and 7 show SEM images of the nanostructured thin films produced in Example 1. In FIG. 6, the left dark portion represents the nanoparticles and the right bright portion represents the micro-undulated structure formed on the nanoparticle layer. FIG. 7 is a surface SEM image of the high-density nanostructure produced in Example 1. Referring to FIG. 7, the micro-undulated surfaces were formed on the surface of the nanoparticles of the nanoparticle layer, and the nanoparticles were arranged in a hexagonal pattern to form a high-density packed structure, as marked in the image.

Although exemplary embodiments have been disclosed for illustrative purposes, those skilled in the art will appreciate that various modifications and changes can be made in exemplary embodiments without departing from the spirit and scope of the invention. Therefore, the scope of the invention should be defined by the claims that follow.

What is claimed is:

1. A nanostructured thin film, comprising a nanoparticle layer comprising a number of regularly arranged nanoparticles which do not overlap each other, wherein upper surfaces of the nanoparticles form an undulated surface, and
   micro-undulated structures on the nanoparticle layer and comprising a number of micro-structures each smaller in size than the nanoparticles, wherein upper surfaces of the micro-structures form a micro-undulated surface, wherein
   the nanoparticle layer and the micro-undulated structures comprise different materials from each other and define a bilayer structure of the nanostructured thin film,
   the micro-undulated structures collectively entirely cover the upper surfaces of the nanoparticles, and
   a plurality of micro-structures entirely covers the upper surface of each nanoparticle, respectively.

2. The nanostructured thin film of claim 1, wherein the nanoparticle layer has a monolayer or multilayer structure.

3. The nanostructured thin film of claim 1, wherein the nanoparticles have a single or core-shell double structure composed of an inorganic material, a metal, a semiconductor or a polymer.

4. The nanostructured thin film of claim 3, wherein the nanoparticles include at least one material selected from the group consisting of gold, silver, chromium, molybdenum, nickel, cobalt, iron, titanium, ZnO, alumina, silicon and polystyrene.

5. The nano structured thin film of claim 1, wherein the micro-undulated surfaces include at least one material selected from the group consisting of metal oxides, metal nitrides and metal carbides.

6. The nanostructured thin film of claim 5, wherein the metal oxide is selected from the group consisting of $TiO_2$, $ZnO$, $Co_3O_4$, $CoO$, $SiO_2$, $SnO_2$, $WO_3$, $Ta_2O_3$, $BaTiO_3$, $BaZrO_3$, $ZrO_2$, $HfO_2$, $Al_2O_3$, $Y_2O_3$, $ZrSiO_4$, $Fe_2O_3$, $Fe_3O_4$, $CeO$, $CrO_3$, and mixtures thereof.

7. The nano structured thin film of claim 1, wherein the micro-undulated surfaces have a shape selected from nanoflowers, nanotrees, nanobouquets, nanodots, nanobelts, nanoribbons, nanopyramids, nanowavys and nanocavities.

8. The nanostructured thin film of claim 1, wherein the nanoparticles are arranged adjacent to one another or spaced apart from one another at regular intervals.

9. The nanostructured thin film of claim 1, wherein the nanoparticles are arranged in a predetermined pattern.

10. A method for controlling the surface properties of a nanostructured thin film, the method comprising
providing a nanoparticle layer comprising regularly arranged nanoparticles which do not overlap each other, wherein upper surfaces of the nanoparticles form an undulated surface, and
providing micro-undulated structures on the nanoparticle layer and comprising a number of micro-structures each smaller in size than the nanoparticles, wherein upper surfaces of the micro-structures form a micro-undulated surface,
wherein
the nanoparticle layer and the micro-undulated structures comprises different materials from each other and define a bilayer structure of the nanostructured thin film,
the micro-undulated structures collectively entirely cover the upper surfaces of the nanoparticles, and
a single micro-structure is smaller in cross-sectional thickness with respect to a single nanoparticle, and entirely covers the upper surface of the single nanoparticle.

11. The method of claim 10, wherein the nanoparticle layer is formed using inorganic material, metal, semiconductor or polymer nanoparticles by colloidal lithography.

12. The method of claim 10, wherein the micro-undulated surfaces are formed using a material selected from the group consisting of metal oxides, metal nitrides and metal carbides by chemical vapor deposition, RF magnetron sputtering, DC magnetron sputtering, ion/e-beam sputtering, pulsed laser deposition or atomic layer deposition.

13. The method of claim 10, wherein the nanoparticles are patterned in a certain pattern.

14. The method of claim 10, wherein the nanoparticles or the micro-undulated surfaces are formed into a multilayer structure.

15. The method of claim 10, further comprising treating the nanostructured thin film with a low surface energy material.

16. An electronic device comprising the nanostructured thin film of claim 1.

17. The electronic device of claim 16, wherein the electronic device is an LED, a laser device, a memory device, a sensor, a photovoltaic device or a DNA chip.

18. A functional coating comprising the nanostructured thin film of claim 1, the functional coating being a self-cleaning coating, a water repellent coating, a hydrophilic coating or a contamination-free coating.

* * * * *